United States Patent

Beneking

[15] 3,659,161

[45] Apr. 25, 1972

[54] BLOCKING FIELD EFFECT TRANSISTOR

[72] Inventor: Heinz Beneking, Aachen, Germany

[73] Assignee: Licentia Patent-Verwaltungs-G.m.b.H., Frankfurt am Main, Germany

[22] Filed: Dec. 16, 1970

[21] Appl. No.: 98,802

[30] Foreign Application Priority Data

Jan. 2, 1970 Germany ....................P 20 00 092.4
Jan. 2, 1970 Germany ....................P 70 00 076.9

[52] U.S. Cl. ....................317/235, 317/234
[51] Int. Cl. ....................H01l 11/14
[58] Field of Search ....................317/235, 234

[56] References Cited

UNITED STATES PATENTS

| | | | |
|---|---|---|---|
| 3,528,168 | 9/1970 | Adamic, Jr. | 29/571 |
| 3,533,158 | 10/1970 | Bower | 29/571 |
| 3,562,608 | 2/1971 | Gallagher | 317/235 |

*Primary Examiner*—James D. Kallam
*Attorney*—Spencer & Kaye

[57] ABSTRACT

A blocking field effect transistor comprises a semiconductor body having two main electrodes thereon which form barrier layers and a gate electrode which is insulated from the semiconductor body, positioned between the two main electrodes but spaced from one of the main electrodes at its edge adjacent thereto.

5 Claims, 2 Drawing Figures

Patented April 25, 1972 3,659,161

Inventor:
Heinz Beneking

BY Spencer & Kaye
ATTORNEYS

BLOCKING FIELD EFFECT TRANSISTOR

BACKGROUND OF THE INVENTION

The present invention relates to a blocking field effect transistor consisting of a semiconductor body of the first type of conductivity and two main electrodes which form a barrier layer and are mounted on the semiconductor body and between which, separated from the semiconductor body by an insulating layer, is a gate electrode. Field effect transistors are termed blocking when the actual conducting channel only develops when a finite voltage is applied between gate electrode and source electrode, for example by inversion of the surface layer of the semiconductor body between the main electrodes.

The field effect transistor with insulated gate electrode is also frequently termed an MOS field effect transistor in the literature because an oxide of the semiconductor material is generally used as an insulating layer between semiconductor body and metallic gate electrode. A MOS field effect transistor generally consists of a semiconductor body of the first type of conductivity in which two regions of the second type of conductivity are introduced from one surface, at a specific distance apart, as source and drain electrodes.

In a known form, the surface of the semiconductor body containing the source and drain regions is covered with an oxide layer which is used as a diffusion mask, in known manner, during the indiffusion of the two regions of the second type of conductivity. After diffusion has been effected, apertures are formed in the oxide layer over the two indiffused regions, in which apertures there are provided contacts, without a barrier layer, to the two indiffused regions. These contacts are frequently also termed main electrodes of the transistor. The gap between these two indiffused regions remains covered, for example with this insulating layer, or it receives another on which the flat metallic gate electrode is mounted. The PN junctions formed by the source and drain region generally extend under the insulating layer carrying the gate electrode.

In all the blocking field effect transistors hitherto known with an insulated gate electrode, the gate electrode covers at least the whole surface area of the insulating layer situated between the barrier layers of the source and drain region. The reason is that it was hitherto believed that the entire gap had to be made conducting when a voltage was applied between gate and drain electrodes. In many cases, the gate electrode even overlaps the barrier layers surrounding the source and drain regions because the barrier layers end under the oxide layer and the entire oxide layer between the two main electrodes is covered by the gate electrode.

The known field effect transistors still have too high a reactive capacitance between the control region and the drain region for many applications.

SUMMARY OF THE INVENTION

It is an object of the invention to improve field effect transistors and to reduce the reactive influence in them.

According to the invention, there is provided a blocking field effect transistor comprising a semiconductor body having one type of conductivity, two main electrodes on said semiconductor body which form barrier layers and a gate electrode positioned between said two main electrodes, insulated from said semiconductor body and having an edge adjacent to but spaced from said barrier layer formed by one of said main electrodes.

BRIEF DESCRIPTION OF THE DRAWINGS

The invention will now be described in greater detail, by way of example, with reference to the accompanying drawings, in which.

DESCRIPTION OF THE PREFERRED EMBODIMENT

Basically, it is proposed, in accordance with the invention, in a blocking field effect transistor comprising two main electrodes which form barrier layers in a semiconductor body and a flat gate electrode insulated from the semiconductor body and positioned between the main electrode, that the flat gate electrode should not border on the barrier layer formed by the one main electrode or overlap this barrier layer but that the margin of the gate electrode should end at a specific distance from this barrier layer.

The blocking field effect transistor is operated by enrichment of charge carriers in the channel area between the source and drain regions. The charge carriers necessary for conducting the current must be enriched in the channel area by applying a control voltage to the gate electrode. When the control voltage is zero, there is no channel. In addition, since the PN junction between the drain region and the semiconductor body is blocked, no current — apart from residual currents — flows between the drain and source electrodes when the control voltage is zero.

The main electrodes forming the barrier layer or, in other words, the source region and the drain region preferably consist of regions of the second type of conductivity which are introduced into the semiconductor body of the first type of conductivity and which are both introduced into the semiconductor body at the same surface The source region and the drain region are preferably produced by indiffusion of impurities.

There is the possibility, however, of dispensing with indiffused drain and source regions and replacing these regions by metal contacts with a directional effect. Such contacts are frequently also termed Schottky contacts.

The distance between the gate electrode and the one main electrode forming a barrier layer is preferably selected so that, beyond a specific threshold voltage applied between the two main electrodes, the transistor has the characteristic curve of a conventional field effect transistor with an insulated gate electrode.

Figure 1:
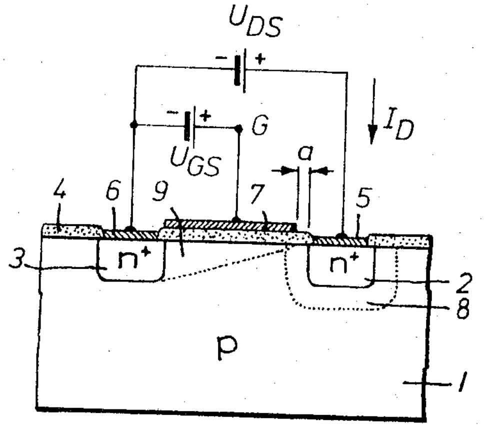
FIG. 1 is a sectional view of a field effect transistor in accordance with the invention.

Referring now to the drawings, in FIG. 1, a semiconductor body 1 is illustrated which consists, for example, of silicon and is of P-type conductivity. Two regions 2 and 3 of $N^+$-type of conductivity are diffused, at a specific distance apart, into this semiconductor body from one surface covered with an oxide masking layer 4. The region 3 forms the source region, while the region 2 represents the drain region. Both regions are provided with a contact 5 or 6 respectively. Between the two regions 2 and 3, on the semiconductor surface, there is the insulating layer 4 which covers the channel area 9 and on which there is mounted the gate electrode 7. This gate electrode ends at a specific distance *a* in front of the barrier layer surrounding the drain region 2 when the voltage $U_{DS}$ is absent.

When a positive potential in relation to the source electrode 6 is applied to the gate electrode 7, a channel 9 of N-type conductivity develops under the oxide layer. This channel originates from the source region 3 and becomes narrower towards the drain region 2. This form of channel limitation is based on the voltage drop in the channel area. The voltage $U_{DS}$ is applied between the drain electrode and the source electrode and drives the drain current $I_D$ through the channel. As a result of this voltage between the main electrodes, an area 8 of space charge develops round the drain region 2 stressed in the reverse direction and is bounded by the broken line illustrated.

Figure 2:
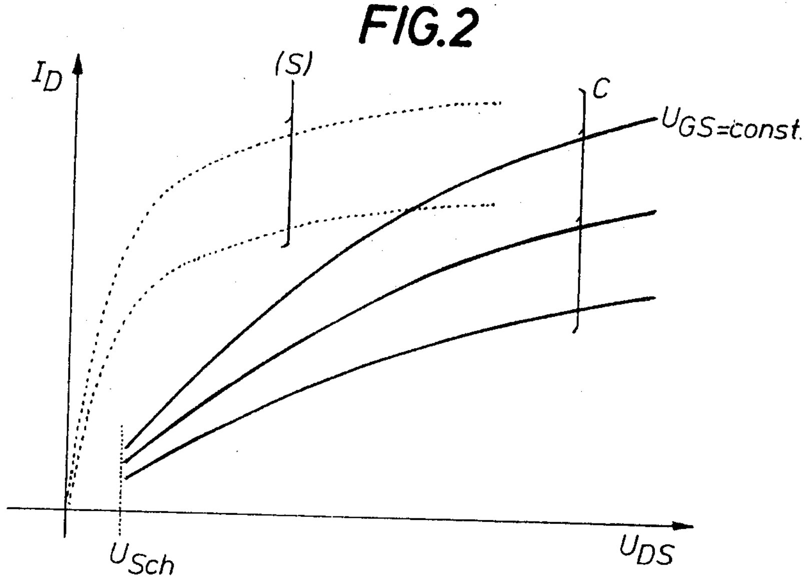
FIG. 2 shows the characteristic curves of such a field effect transistor.

The field effect transistor illustrated functions in the required manner when the inversion layer 9 and the space charge region 8 abut or overlap one another. The electrons, which in this case approach the margin of the space charge region 8 at the end of the channel, are then conveyed to the drain electrode by the electrical field in the space-charge region. For this reason, the gate electrode can be shortened, according to the invention, in the vicinity of the drain region in comparison with the dimensions otherwise usual. The necessary threshold voltage $U_{Sch}$ at which the characteristic curve known from field effect transistors will also begin with the component according to the invention, is determined by the voltage at which, with a predetermined control voltage, the space-charge regions abuts against the area of the inversion channel. The distance *a* can therefore be selected so that the connection between the space charge region and the inversion layer comes about at a required threshold voltage. The characteristics of the field effect transistors constructed according to the invention are illustrated in FIG. 2. The characteristic curves *s* are illustrated as broken lines and characterize transistors in which no shortened gate electrode is used. The characteristic curves *c*, on the other hand, characterize transistors with shortened gate electrodes. These characteristic curves are more or less cut off while the reactive influence is greatly reduced with alternating-current parameters otherwise comparable with conventional transistors.

The essence of the present invention can be summarized in that a field effect transistor is provided wherein the extent of the metal gate electrode over the insulating layer present above the channel area is only selected so great, in the area bordering on the drain electrode, that, beyond a specific voltage $U_{DS}$, the transistor functions like a MOS field effect transistor, the gate electrode of which overlaps the drain region or borders on this.

It will be understood that the above description of the present invention is susceptible to various modifications, changes and adaptations.

What is claimed is:

1. A blocking field effect transistor comprising a semiconductor body having one type of conductivity, two main electrodes on said semiconductor body which form barrier layers and a gate electrode positioned between said two main electrodes, said gate electrode being insulated from said semiconductor body and having an edge adjacent to but spaced from said barrier layer formed by one of said main electrodes.

2. A transistor as defined in claim 1, wherein said gate electrode is flat and is separated from said semiconductor body by an insulating layer.

3. A transistor as defined in claim 2, wherein said edge of said gate electrode and said barrier layer of said one main electrode are spaced a distance apart whereby upon a given gate electrode voltage current may flow between said main electrodes when the voltage between said main electrodes exceeds a threshold value.

4. A transistor as defined in claim 2, wherein said insulating layer comprises silicon dioxide.

5. A transistor as defined in claim 2, wherein said main electrodes forming the barrier layer comprise two regions of the opposite type of conductivity to that of said semiconductor body and said regions are disposed at one surface of said semiconductor body.

* * * * *